United States Patent
Kameshima

(10) Patent No.: US 9,224,879 B2
(45) Date of Patent: Dec. 29, 2015

(54) SEMICONDUCTOR DEVICE AND ELECTRONIC DEVICE

(71) Applicant: Sony Corporation, Tokyo (JP)

(72) Inventor: Takatoshi Kameshima, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/945,975

(22) Filed: Jul. 19, 2013

(65) Prior Publication Data
US 2014/0054739 A1 Feb. 27, 2014

(30) Foreign Application Priority Data

Aug. 24, 2012 (JP) ................................ 2012-185081

(51) Int. Cl.
| | |
|---|---|
| *H01L 33/00* | (2010.01) |
| *H01L 31/02* | (2006.01) |
| *H01L 23/00* | (2006.01) |
| *H01L 27/146* | (2006.01) |
| *H01L 23/31* | (2006.01) |

(52) U.S. Cl.
CPC .......... *H01L 31/02019* (2013.01); *H01L 24/03* (2013.01); *H01L 24/05* (2013.01); *H01L 27/14618* (2013.01); *H01L 27/14636* (2013.01); *H01L 23/3192* (2013.01); *H01L 24/16* (2013.01); *H01L 24/45* (2013.01); *H01L 24/48* (2013.01); *H01L 24/78* (2013.01); *H01L 24/81* (2013.01); *H01L 24/85* (2013.01); *H01L 2224/02166* (2013.01); *H01L 2224/03452* (2013.01); *H01L 2224/0401* (2013.01); *H01L 2224/04042* (2013.01); *H01L 2224/05556* (2013.01); *H01L 2224/05624* (2013.01); *H01L 2224/45144* (2013.01); *H01L 2224/48091* (2013.01); *H01L 2224/48465* (2013.01); *H01L 2224/48624* (2013.01); *H01L 2224/78301* (2013.01); *H01L 2224/81201* (2013.01); *H01L 2224/85181* (2013.01); *H01L 2924/15787* (2013.01)

(58) Field of Classification Search
CPC .............. H01L 24/05; H01L 27/14618; H01L 27/14636; H01L 24/03; H01L 31/02019
USPC .................. 257/459, 676, 673, 737, 765, 771, 257/779–784, E23.158, E23.159, E23.02, 257/E23.021
See application file for complete search history.

(56) References Cited

U.S. PATENT DOCUMENTS

| | | | | |
|---|---|---|---|---|
| 5,834,846 | A * | 11/1998 | Shinriki ............ | H01L 21/28518 257/751 |
| 2001/0033028 | A1* | 10/2001 | Matsumoto ....... | H01L 21/76801 257/765 |
| 2003/0013291 | A1* | 1/2003 | Chen et al. ..................... | 438/613 |
| 2003/0052339 | A1* | 3/2003 | Harada et al. .................. | 257/200 |
| 2005/0173806 | A1* | 8/2005 | Matsubara ..................... | 257/774 |
| 2008/0258307 | A1* | 10/2008 | Ito ................................. | 257/771 |
| 2012/0086092 | A1* | 4/2012 | Yanagita ........... | H01L 27/14636 257/432 |
| 2012/0217604 | A1* | 8/2012 | Shibuki ............. | H01L 27/14632 257/443 |
| 2013/0037958 | A1* | 2/2013 | Ho et al. ........................ | 257/773 |

FOREIGN PATENT DOCUMENTS

JP 2011-192669 9/2011

\* cited by examiner

*Primary Examiner* — Cuong Q Nguyen
*Assistant Examiner* — Yosef Gebreyesus
(74) *Attorney, Agent, or Firm* — Sony Corporation

(57) ABSTRACT

There is provided a semiconductor device including a substrate made from a semiconductor material, and layers that are made from plural kinds of materials and formed over the substrate. An opening portion that is formed to penetrate at least a layer formed as an insulating film among the layers formed over the substrate and expose a surface of an electrode pad is filled with aluminum or an aluminum alloy.

18 Claims, 11 Drawing Sheets

SEMICONDUCTOR DEVICE AND ELECTRONIC DEVICE

BACKGROUND

The present technology relates to a semiconductor device and an electronic device, and more particularly, to a semiconductor device and an electronic device, which are capable of providing a sophisticated solid state imaging element while maintaining a high accuracy of a wire bonding process.

Generally, in a solid state imaging element, a photoelectric conversion unit is disposed in an imaging region at the center of a chip, a circuit unit is disposed in the periphery thereof, the periphery thereof is a chip edge region, and a plurality of wire bonding pad electrodes including an aluminum (Al)-based alloy film (for example, aluminum copper) for an external interconnection are disposed on the chip edge region.

The surface of the wire bonding pad electrode is covered with an insulating film or the like, but a metallic surface of the wire bonding pad is exposed as the insulating film or the like is opened.

In an assembly process of a semiconductor device, in order to electrically connect a semiconductor chip with a package, a wire bonding process of connecting an exposed metallic surface (pad electrode) on the semiconductor chip with an inner lead of the package using a metallic wire is performed.

Here, when a solid state imaging element is manufactured, a ball bonding technique is widely used as a wire bonding process, and pressure bonding is performed using a bonding wire made of gold (Au) such that a certain amount of load, heat, and ultrasonic vibration when an ultrasonic wave is used in combination are applied to a wire. At this time, in the solid state imaging element, for example, a heating temperature is set to be 250° C. or less on a chip in view of heat resistance of a material for a color filter to be mounted.

In the wire bonding process, a tool called a capillary is used, and a gold (Au) ball is pressure-bonded by moving the capillary to the position directly above an opened wire bonding pad and then moving the capillary down. At this time, the shape of the opened pad significantly affects the accuracy of the wire bonding process.

When the surface of the wire bonding pad is present at the deep position from the surface of the semiconductor chip, since the distance by which the capillary is moved down increases, the accuracy of the wire bonding process is lowered. For this reason, when the surface of the wire bonding pad is present at the deep position from the surface of the semiconductor chip, pressure bonding misregistration, a wire disconnection defect, or the like is likely to occur. Further, dust or moisture generated due to dicing is likely to remain, and a risk of pad corrosion (external appearance defect) also increases.

In recent years, from a point of view of power consumption, MOS types such as a complementary metal oxide semiconductor (CMOS) are widely used as a solid state imaging element mounted in a mobile device such as a mobile telephone with a camera or a personal digital assistant (PDA).

Further, as a MOS type solid state imaging element, in order to achieve high sensitivity, low noise, and high quality characteristics, a bottom-emission solid state imaging element having a structure in which light is emitted from a back side of a silicon (Si) substrate rather than a top-emission structure in the related art has been developed as a pixel structure.

However, in the top-emission structure in the related art, the depth of the wire bonding pad is 2 µm or less, and in the MOS type bottom-emission solid state imaging element, the depth of the wire bonding pad is 5 to 8 µm. Thus, the accuracy of the wire bonding process is lowered, and a process margin decreases. As a result, an occurrence risk of a characteristic defect or deterioration of reliability of a wire bonding increases.

In addition, in recent years, as a more than more technique, substrate stacking (3D device) has been leading the semiconductor industry. Here, as a next generation bottom-emission solid state imaging element, a bottom-emission solid state imaging element having a stacked structure, which is a leading product of a high-functional 3D device, has been developed, and mass production thereof is expected.

However, in the bottom-emission type having a stacked structure, the position of the wire bonding pad is 12 µm or more which is deeper than in the bottom-emission type, and deeper than in products in the related art. For this reason, it is becoming more technically difficult to form a wire bonding directly on a pad.

In this regard, a technique in which an electrode used to perform wire bonding is exposed to the chip surface has been proposed (for example, see JP 2011-192669 A). In the technique disclosed in JP 2011-192669 A, in a dicing region on which a pad, a bonding wire, a laser melting groove, and a dicing groove are arranged, the pad is formed on an anti-reflection film and electrically connected to an interconnection layer formed in an inter-layer insulating film.

SUMMARY

However, when the technique disclosed in JP 2011-192669 A is used, there is a problem in that the number of interconnection processes increases, and the chip area size increases.

It is desirable to provide a highly functional solid state imaging element while maintaining a high accuracy of a wire bonding process.

According to a first embodiment of the present technology, there is provided a semiconductor device including a substrate made from a semiconductor material, and layers that are made from plural kinds of materials and formed over the substrate. An opening portion that is formed to penetrate at least a layer formed as an insulating film among the layers formed over the substrate and expose a surface of an electrode pad is filled with aluminum or an aluminum alloy.

A wire electrically connected to the pad electrode can be connected, by wire bonding, to the aluminum or the aluminum alloy with which the opening portion is filled.

The aluminum or the aluminum alloy with which the opening portion is filled can include a convex portion protruding from a surface of the semiconductor device.

The convex portion can be pressure-bonded to another conductor electrically connected to the pad electrode, and connected to the other conductor by flip chip bonding.

The aluminum or the aluminum alloy can be selectively deposited in the opening portion by a CVD technique and fill the opening portion with the aluminum or the aluminum alloy.

The aluminum or the aluminum alloy can be deposited by thermal growth using aluminum or an aluminum alloy included in the pad electrode as a seed using a DMAH gas as a dilution gas.

Vapor-phase grown aluminum or aluminum alloy can be deposited in the opening portion using a resist mask.

The semiconductor device can be configured as bottom-emission MOS type solid state imaging element.

The semiconductor device can be configured as a bottom-emission MOS type solid state imaging element having a stacked structure.

According to a second embodiment of the present technology, there is provided an electronic device including a substrate made from a semiconductor material, and layers that are made from plural kinds of materials and formed over the substrate. An opening portion that is formed to penetrate at least a layer formed as an insulating film among the layers formed over the substrate and expose a surface of an electrode pad is filled with aluminum or an aluminum alloy.

In the first and second embodiments of the present technology, an opening portion that is formed to penetrate at least a layer formed as an insulating film among the layers formed over the substrate and expose a surface of an electrode pad is filled with aluminum or an aluminum alloy.

According to the embodiments of the present technology described above, it is possible to provide a highly functional solid state imaging element while maintaining a high accuracy of a wire bonding process.

DETAILED DESCRIPTION OF THE EMBODIMENT(S)

Figure 1:
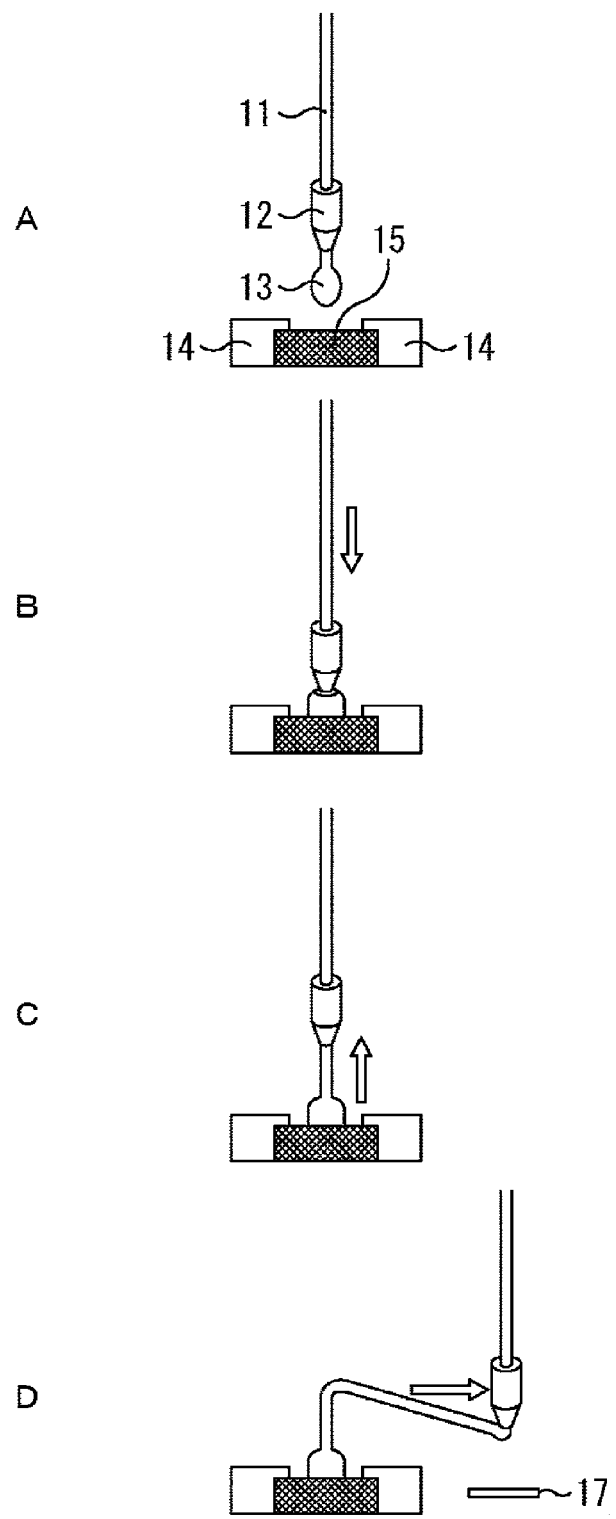
FIG. 1 is a diagram for describing an example of a wire bonding process.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, an embodiment of a technology disclosed here will be described with reference to the accompanying drawings.

FIG. 1 is a diagram for describing an example of a wire bonding process.

In an assembly process of a semiconductor device, in order to electrically connect a semiconductor chip with a package, a wire bonding process of connecting an exposed metallic surface (pad electrode) on the semiconductor chip with an inner lead of the package using a metallic wire is performed.

Here, for example, when a solid state imaging element is manufactured, a ball bonding technique is widely used as a wire bonding process, and pressure bonding is performed using a bonding wire made of gold (Au) such that a certain amount of load, heat, and ultrasonic vibration when an ultrasonic wave is used in combination are applied to a wire.

First, as illustrated in FIG. 1A, a bonding wire 11 made of gold (Au) is moved onto a pad electrode 15 using a capillary 12. A leading end portion (ball) 13 of the bonding wire 11 is formed in a ball shape, and as illustrated in FIG. 1B, the capillary 12 is moved down to cause the ball portion 13 to be pressure-bonded to the pad electrode 15 exposed from an the insulating film 14. At this time, a certain amount of load, heat, and ultrasonic vibration are applied to the bonding wire 11.

Thereafter, as illustrated in FIG. 1C, the capillary 12 is moved up, and as illustrated in FIG. 1D, the capillary 12 is moved toward an inner lead 17 to cause the bonding wire 11 to be connected with the inner lead 17.

In the wire bonding process, when the surface of the pad electrode 15 is present at the deep position from the surface (the surface of the insulating film 14 in FIG. 1) of the semiconductor chip, the distance by which the capillary 12 is moved down is long, and the accuracy of the wire bonding process deteriorates. For this reason, when the surface of the pad electrode 15 is present at the deep position from the surface of the semiconductor chip, pressure bonding misregistration, a wire disconnection defect, or the like is likely to occur. In addition, dust or moisture generated due to dicing is likely to remain, and a risk of pad corrosion (external appearance defect) also increases.

In recent years, from a point of view of power consumption, MOS types such as a CMOS type are widely used as a solid state imaging element that is mounted in a mobile device such as a mobile telephone with a camera or a PDA.

Further, as a MOS type solid state imaging element, in order to achieve high sensitivity, low noise, and high quality characteristics, a bottom-emission solid state imaging element having a structure in which light is emitted from a back side of a silicon (Si) substrate rather than a top-emission structure in the related art have been developed as a pixel structure.

Figure 2:
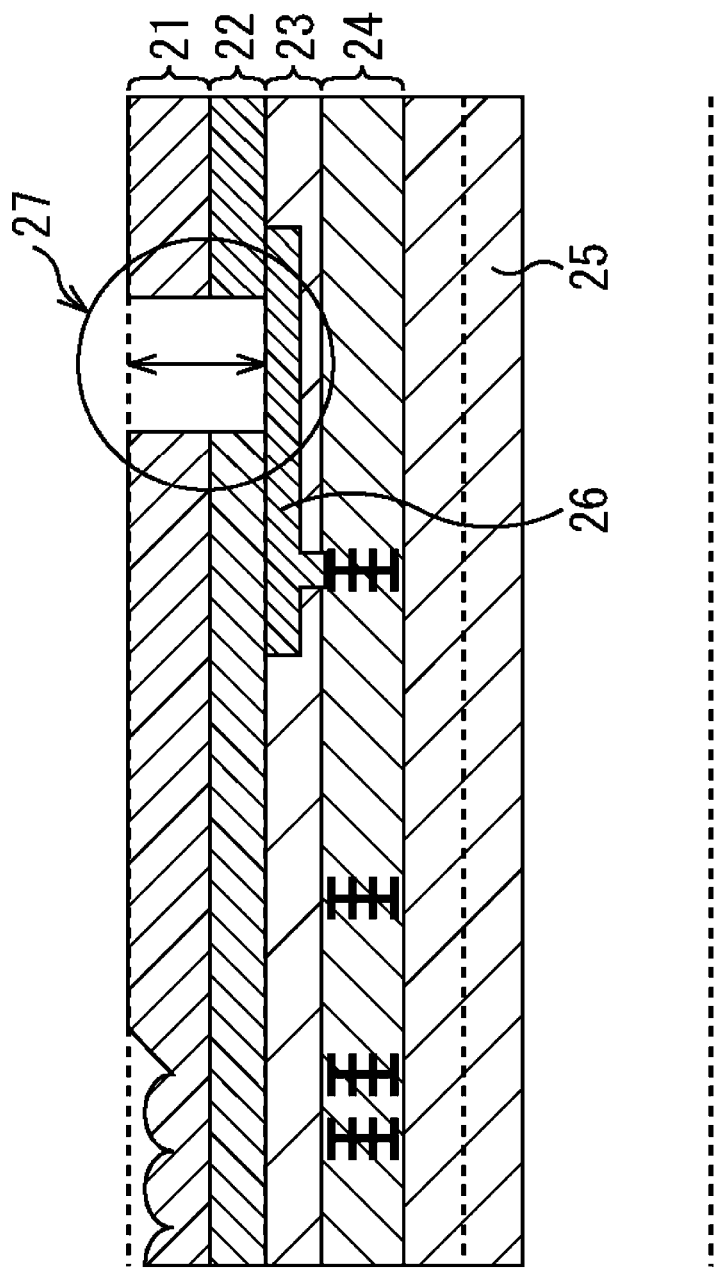
FIG. 2 is a diagram for describing a structure of a top-emission MOS type solid state imaging element.

FIG. 2 is a diagram for describing a structure of a MOS type solid state imaging element.

FIG. 2 a MOS type solid state imaging element having a top-emission structure. In the example of FIG. 2, a MOS type solid state imaging element configured as a semiconductor chip includes a custom material (organic substance material) layer 21, an insulating film layer 22, an adhesive layer 23, an inter-layer insulating film 24 for circuit forming, and a silicon substrate 25 in order from the top in FIG. 2. An on-chip lens, a color filter, and the like are formed on the custom material layer 21, an electric interconnection is formed over the inter-layer insulating film 24 for circuit forming, and a photo diode is formed over the silicon substrate 25.

Since a pad electrode 26 is arranged in the adhesive layer 23, in order to perform wire bonding on the pad electrode 26, it is necessary to expose the surface of the pad electrode 26, and to this end, it is necessary to form an opening portion 27 that penetrates the custom material layer 21 and the insulating film layer 22.

In the case of the top-emission MOS type solid state imaging element, light radiated from above in FIG. 2 passes through the inter-layer insulating film 24 for circuit forming until reaching the photo diode formed on the silicon substrate 25. As described above, since an electrical interconnection is formed in the inter-layer insulating film 24 for circuit forming, for example, a phenomenon in which light reflects against an interconnection in the middle of a light path toward the photo diode may occur. In this case, for example, it is difficult to cause light collected by an on-chip lens to efficiently reach the photo diode. For this reason, a bottom-emission MOS type solid state imaging element has been developed.

Figure 3:
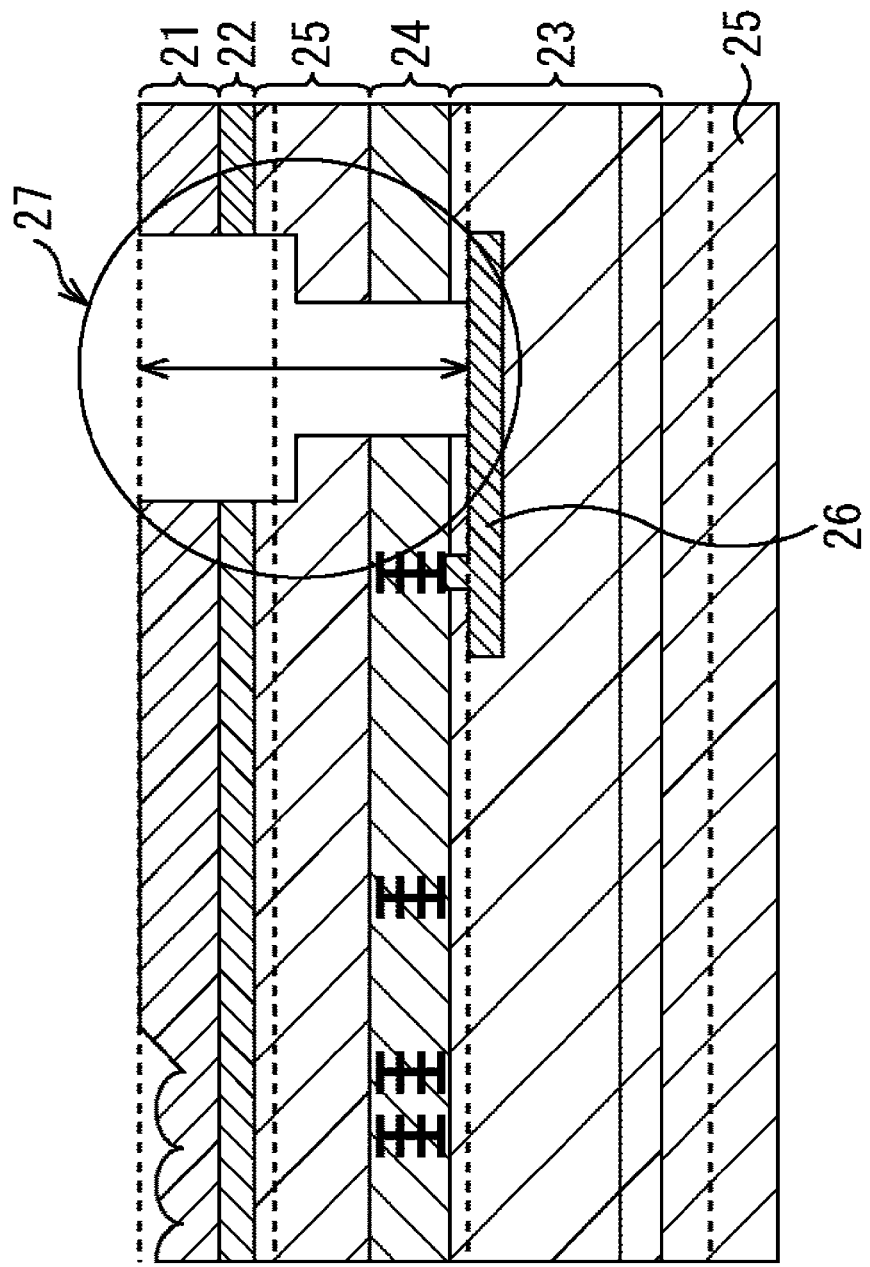
FIG. 3 is a diagram for describing a structure of a bottom-emission MOS type solid state imaging element.

FIG. 3 illustrates a bottom-emission MOS type solid state imaging element configured as a semiconductor chip. In the bottom-emission MOS type solid state imaging element, light is emitted from the opposite surface (back surface side) of the silicon substrate, and thus the amount of light entering a unit pixel can be increased without influence from an interconnection or a transistor.

In the configuration example of FIG. 3, the insulating film layer 22 is connected in a state in which the top and bottom of the adhesive layer 23, the inter-layer insulating film 24 for circuit forming, and the silicon substrate 25 of FIG. 2 are inverted. In other words, the back side of the silicon substrate 25 in FIG. 2 is positioned directly below the insulating film layer 22 in FIG. 3. In the configuration example of FIG. 3, in order to perform wire bonding on the pad electrode 26 arranged in the adhesive layer 23, it is necessary to form an opening portion 27 that penetrates the silicon substrate 25, and the inter-layer insulating film 24 for circuit forming as well as the custom material layer 21 and the insulating film layer 22. Thus, the opening portion 27 in the example of FIG. 3 is deeper than that in the example of FIG. 2.

For example, in the top-emission MOS type solid state imaging element, the depth to the pad electrode 26 is 2 μm or less, whereas in the bottom-emission MOS type solid state imaging element, the depth to the pad electrode 26 is 5 to 8 μm.

Further, in recent years, as a next generation bottom-emission solid state imaging element, a bottom-emission solid state imaging element having a stacked structure, which is a leading product of a high-functional 3D device, has been developed, and mass production thereof is expected.

Figure 4:
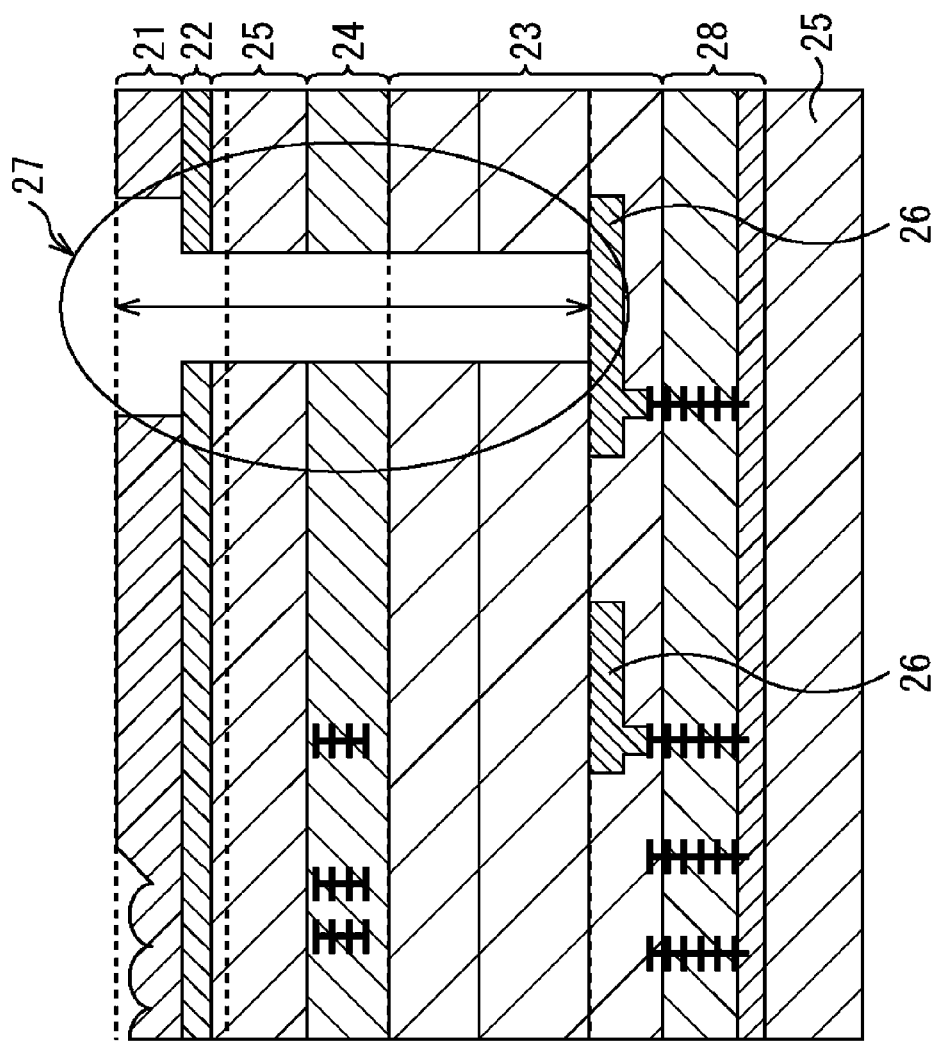
FIG. 4 is a diagram for describing a structure of a bottom-emission MOS type solid state imaging element having a stacked structure.

FIG. 4 illustrates a bottom-emission MOS type solid state imaging element having a stacked structure configured as a semiconductor chip. In the bottom-emission MOS type solid state imaging element having a stacked structure, as layers for forming a circuit are stacked, a large-scale signal processing circuit necessary to implement high image quality and high functionality can be incorporated, and the chip size can be reduced.

In the configuration example of FIG. 4, in addition to the inter-layer insulating film 24 for circuit forming, an inter-layer insulating film 28 for circuit forming is stacked, and a pad electrode 26 is arranged over the inter-layer insulating film 28 for circuit forming. For this reason, in the configuration example of FIG. 4, in order to perform wire bonding on the pad electrode 26, it is necessary to form an opening portion 27 that penetrates the custom material layer 21, the insulating film layer 22, the silicon substrate 25, the inter-layer insulating film 24 for circuit forming, and the adhesive layer 23. Thus, the opening portion 27 in the example of FIG. 4 is deeper than that in the example of FIG. 3.

For example, in the bottom-emission MOS type solid state imaging element having a stacked structure, the depth to the pad electrode 26 is 12 μm or more.

As described above, according to recent technology trends, the depth to the pad electrode 26 tends to further increase, and thus it is difficult to maintain the accuracy of the wire bonding process.

In this regard, in the present technology, even when the depth to the pad electrode 26 further increases, the accuracy of the wire bonding process can be maintained.

Figure 5:
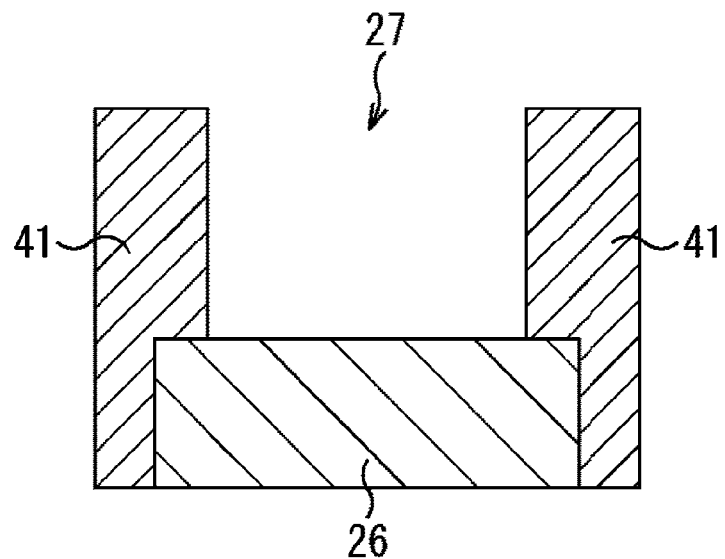
FIG. 5 is diagram for describing wire bonding performed by a technique according to an embodiment of the present technology.

For example, as illustrated in FIG. 5, the pad electrode 26 is assumed to be arranged at the back of the opening portion 27. Here, the opening portion 27 is formed to be surrounded by the peripheral member 41, but actually, as described above with reference to FIG. 2 to FIG. 5, the peripheral member 41 is formed by the custom material layer 21, the insulating film layer 22, and the like.

In the present technology, aluminum or an aluminum alloy is deposited over the surface of the pad electrode 26, and thus the depth to the pad electrode 26 is reduced, and wire bonding can be easily performed. In other words, aluminum or an aluminum alloy is deposited over the surface of the pad electrode 26 through crystal growth in which aluminum (Al) or an aluminum alloy that is metal forming the exposed pad electrode 26 serves as a seed using a raw mixture gas decomposed at a low temperature.

For example, aluminum is selectively deposited only on the opening portion 27 by a chemical vapor deposition (CVD) technique using vaporized dimethyl aluminum hydride (DMAH: $AlH(CH_3)_2$) and dilution gas ($H_2$).

The CVD of aluminum using DMAH is disclosed in detail, for example, in JP H4-51525 A.

In the state illustrated in FIG. 5, after a contaminant on the surface of the pad electrode 26 is removed, DMAH gas is supplied, for example, using a dilution gas as a carrier, full pressure and partial pressure of DMAH are appropriately set, and then deposition is performed by the CVD technique. At this time, a CVD process temperature is set in view of a characteristic (for example, heat resistance of a color filter material) of a custom material layer included in the peripheral member 41, and for example, a heating temperature on a wafer is set to be 250° C. or less. For example, a heating temperature on a wafer may be set to 180 to 220° C. When a temperature on a wafer is too low, a raw material gas is not decomposed, and aluminum is not precipitated.

Figure 6:
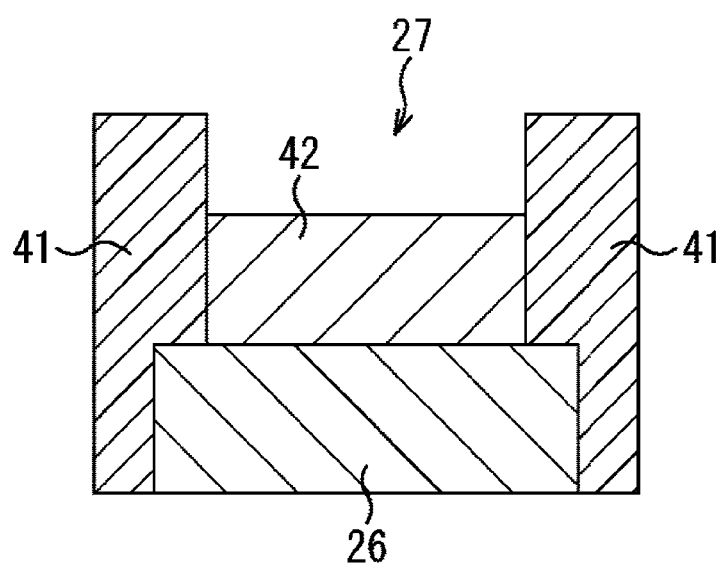
FIG. 6 is diagram for describing wire bonding performed by a technique according to an embodiment of the present technology.

Through the above process, for example, as illustrated in FIG. 6, an aluminum alloy 42 is deposited over the surface of the pad electrode 26. At this time, interface adherence between the pad electrode 26 and the aluminum alloy 42 that is deposited (which has selectively been seed-grown at 200° C.) is adhesion of about 2000 kgf/cm$^2$ and can have a characteristic better than share strength at the time of wire bonding.

Thus, wire bonding is performed on the surface of the aluminum alloy 42, and the pad electrode 26 can be electrically connected.

Figure 7:
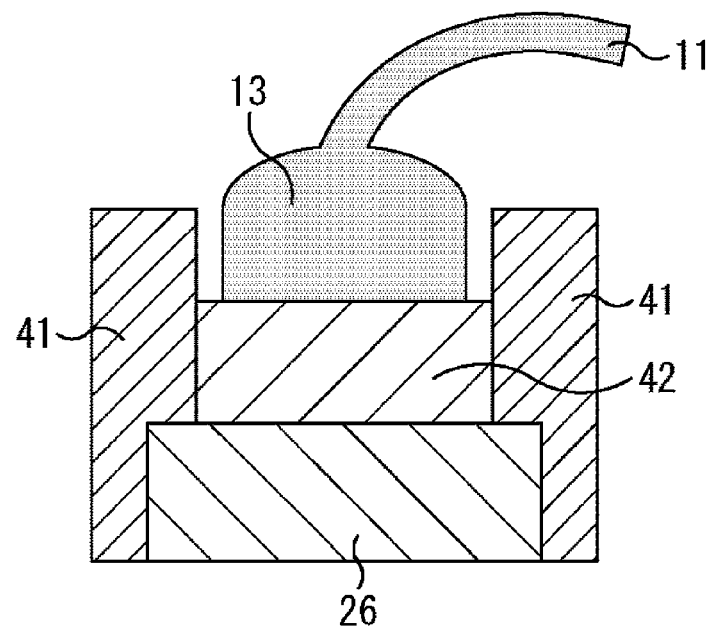
FIG. 7 is diagram for describing wire bonding performed by a technique according to an embodiment of the present technology.

In other words, as illustrated in FIG. 7, wire bonding may be performed such that the ball portion 13 is pressure-bonded to the surface of the aluminum alloy 42. In this case, for example, compared to when wire bonding is performed on the pad electrode 26 in the state illustrated in FIG. 5, the distance by which the ball portion 13 is moved down is reduced, and thus wire bonding can be easily performed. In other words, generally, as the depth to the pad electrode 26 increases, the process margin decreases, but a reduction in the process margin can be suppressed by the present technology.

Alternatively, instead of depositing the aluminum alloy 42 (or aluminum), for example, gold can be buried on the pad electrode 26 using electroless Au plating or the like. However, for example, as in the bottom-emission MOS type solid state imaging element having a stacked structure, when the opening portion 27 is very deep, if the aluminum alloy 42 which is a same-series metal is used, reliability can be increased in terms of adhesion.

Further, electroless Au plating stimulates growth by catalytic reaction in a solution, and when a catalyst adheres to a place other than the pad electrode 26, selective growth may not be performed with a high degree of accuracy. In this regard, when seed crystal growth of aluminum is employed, crystal control is unnecessary, and it is easy to perform selective growth, and selectivity is excellent. Further, aluminum is lower in price than gold.

As described above, according to the present technology, even when the depth to the pad electrode 26 is deep, the accuracy of the wire bonding process can be maintained.

Further, since the aluminum alloy 42 is filled and thus the depth of the opening portion 27 becomes shallow, dust generated at the time of dicing hardly remains, and moisture generated at the time of dicing hardly remains. Accordingly, according to the present technology, a bonding characteristic defect can be suppressed, and reliability can be expected to improve.

In addition, as the aluminum alloy 42 is deposited on the pad electrode 26, tolerance to weighted wire bonding can be increased, and for example, damage such as a crack of an inter-layer film below the pad electrode 26 which is likely to occur at the time of wire bonding in the related art can be removed.

As a result, since the pad electrode 26 can be more thinly formed, for example, a step difference occurring when respective layers of a semiconductor chip adhere to each other can be reduced. Thus, for example, in the top-emission MOS type solid state imaging element, unevenness occurring in a process of coating a custom material or the like can be reduced, and an improvement in performance of a solid state imaging element and an improvement in a yield can be expected. Further, in the bottom-emission MOS type solid state imaging element, a yield of a bonding process performed after a pad electrode is formed can be expected to improve.

In addition, since the surface of the pad electrode 26 is protected by the aluminum alloy 42, an external appearance defect caused by reaction of aluminum ions generated by battery cell reaction and silicon waste and moisture generated at the time of dicing can be suppressed.

Figure 8:
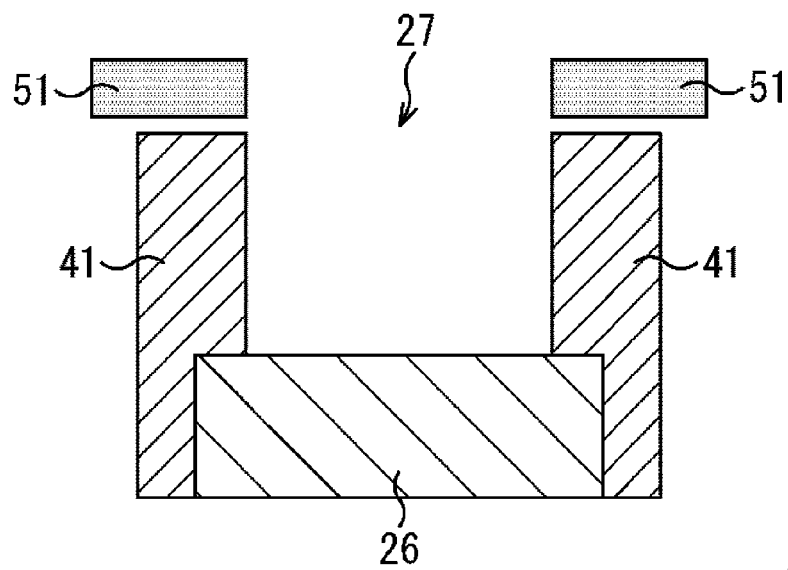
FIG. 8 is diagram for describing wire bonding performed by a technique according to an embodiment of the present technology.

The above description of the example with reference to FIG. 6 has been made under the assumption that an aluminum alloy is thermally grown by the CVD technique, but an aluminum alloy may be vapor-phase grown by the CVD technique. In this case, for example, as illustrated in FIG. 8, a resist mask 51 may be arranged, and only the opening portion 27 may be selectively filled with an aluminum alloy.

The above description has been made in connection with the example in which DMAH is used as a raw material gas used to selectively fill the opening portion 27 with an aluminum alloy, but any other gas may be used. For example, instead of DMAH, an aluminum metallic compound decomposed at a low temperature such as methyl pyrrolidine alane (MPA), triisobutylaluminum (TIBA), monomethylaluminum-dihydride (MMADH), diethyl aluminum hydride (DEAH), trimethylamine alane (TMAA), triethylamine alane (TEAA), or dimethylethylamine alane (DMEAA) may be used.

Figure 9:
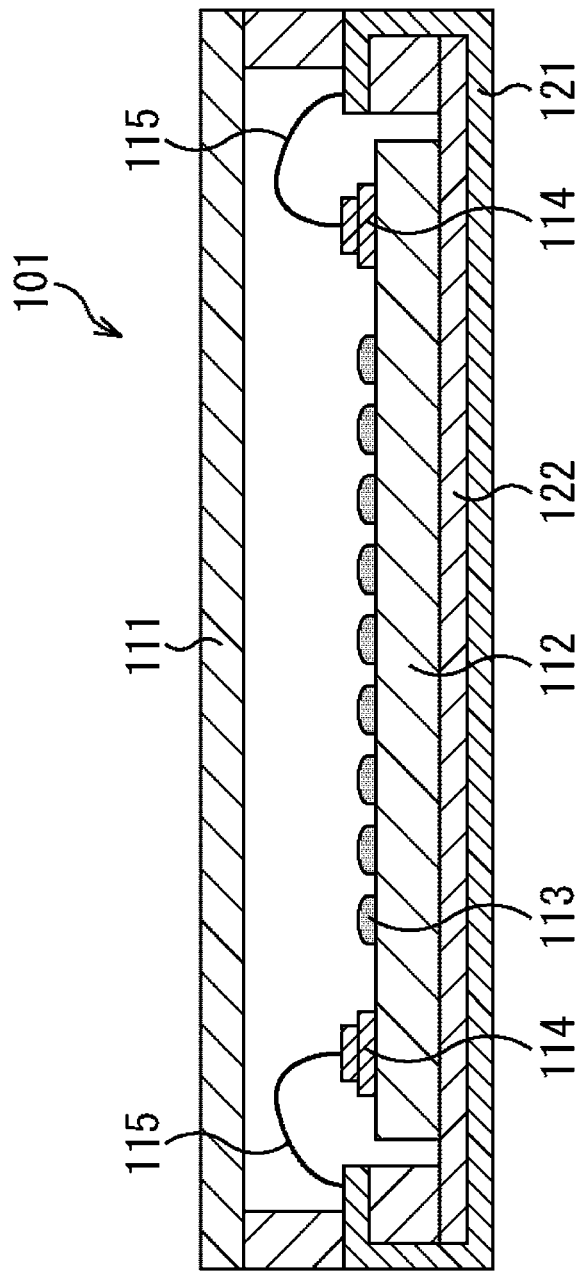
FIG. 9 is a diagram for describing an exemplary configuration of a package structure of a MOS type solid state imaging element according to an embodiment of the present technology.

As described above with reference to FIGS. 5 to 8, wire bonding is performed, and thus a package structure, for example, as illustrated in FIG. 9 can be manufactured.

FIG. 9 is a diagram for describing an exemplary configuration of a package structure of a MOS type solid state imaging element according to an embodiment of the present technology.

In a package structure 101 illustrated in FIG. 9, a semiconductor chip 112 over which a plurality of micro lenses 113 are placed is arranged over a ceramic substrate 122. Further, a glass 111 is placed in parallel with the semiconductor chip 112 with a space interposed therebetween.

In the package structure 101 illustrated in FIG. 9, wire bonding is performed on opening portions 114 at right and left ends of the semiconductor chip 112 such that a wire 115 is connected to an inner lead 121.

Meanwhile, the example of FIG. 9 has been described in connection with the package structure 101 manufactured such that the semiconductor chip 112 is connected with the inner lead 121 by wire bonding, but the semiconductor chip 112 may be connected with the inner lead 121 by flip chip bonding.

Figure 10:
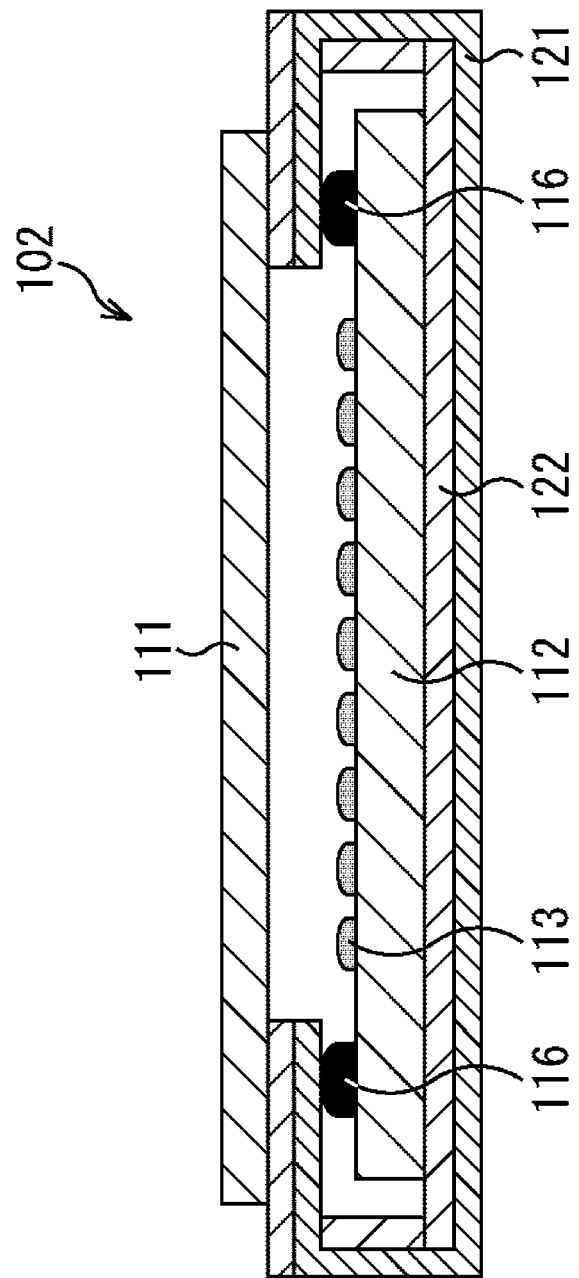
FIG. 10 is a diagram for describing another exemplary configuration of a package structure of a MOS type solid state imaging element according to an embodiment of the present technology.

FIG. 10 is a diagram for describing another exemplary configuration of a package structure of a MOS type solid state imaging element according to an embodiment of the present technology.

In a package structure 102 illustrated in FIG. 10, similarly to the example of FIG. 9, a semiconductor chip 112 over which a plurality of micro lenses 113 are placed is arranged over a ceramic substrate 122. Further, a glass 111 is placed in parallel to the semiconductor chip 112 with a space interposed therebetween.

In the package structure 102 illustrated in FIG. 10, unlike the example of FIG. 9, connecting portions 116 on right and left ends of the semiconductor chip 112 are connected to an inner lead 121 by flip chip bonding.

As the package structure is manufactured as illustrated in FIG. 10, a package structure of a MOS type solid state imaging element smaller than, for example, the example of FIG. 9 can be obtained. The package structure is referred to as a chip size package structure.

As illustrated in FIG. 10, when the semiconductor chip 112 is connected with the inner lead 121 by flip chip bonding, the aluminum alloy 42 is filled more than, for example, in the state illustrated in FIG. 6. In other words, as illustrated in FIG. 11, an aluminum alloy is deposited by the CVD technique such that the opening portion 27 is filled with the aluminum alloy 42, and a circular convex portion 42a is formed on the top surface.

Figure 11:
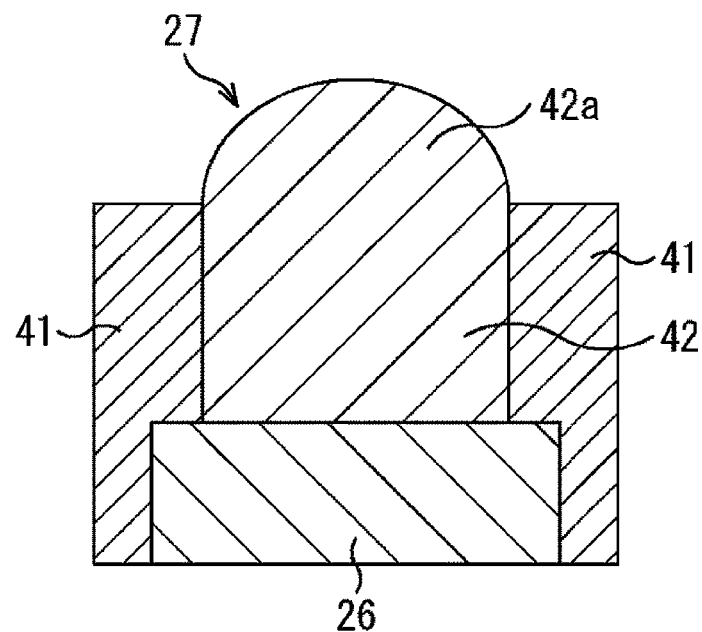
FIG. 11 is diagram for describing flip chip bonding performed by a technique according to an embodiment of the present technology.

The convex portion 42a illustrated in FIG. 11 corresponds to the connecting portion 116 illustrated in FIG. 10 and is connected with the inner lead 121 by flip chip bonding. At this time, the aluminum alloy 42 formed as the convex portion 42a comes in contact with the surface of the inner lead 121 at a point and collapses, and thus bonding can be performed with no non-contact portion. Further, for example, compared to when the convex portion 42a is not disposed and the aluminum alloy 42 comes in contact with the surface of the inner lead 121 at a plane, pressure at the time of bonding is large, and reactivity is improved.

In addition, when the package structure is manufactured as illustrated in FIG. 10, for example, the wire 115 illustrated in FIG. 9 is unnecessary, and thus in a solid state imaging element, a flare or a ghost occurring when light reflects against a wire made of gold can be suppressed.

Further, when the package structure is manufactured as illustrated in FIG. 10, the wire bonding process is unnecessary, and thus various kinds of problems occurring when the accuracy of the wire bonding process deteriorates can be solved.

Figure 12:
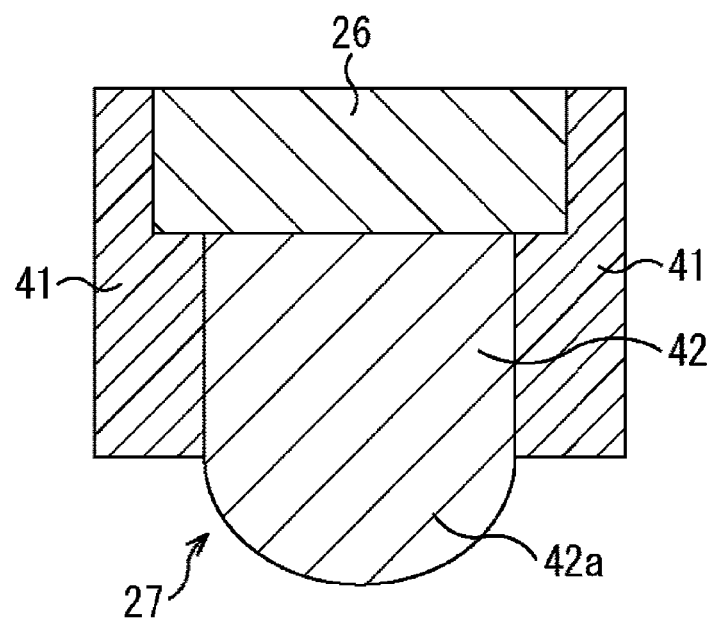
FIG. 12 is diagram for describing flip chip bonding performed by a technique according to an embodiment of the present technology.

The above description has been made in connection with the example in which the opening portion penetrating from the surface of the semiconductor chip to the pad electrode is disposed and filled with an aluminum alloy, but an opening portion penetrating from the back side of a semiconductor chip to a pad electrode may be disposed and filled with an aluminum alloy as illustrated in FIG. 12.

In FIG. 12, an opening portion 27 penetrating a pad electrode 26 is disposed to penetrate a peripheral member 41 from the back side, and the opening portion 27 is filled with an aluminum alloy 42. Further, in the example of FIG. 12, an aluminum alloy is deposited by the CVD technique such that a circular convex portion 42a is formed on the bottom surface.

Accordingly, for example, a connecting portion may be formed on the back side of a semiconductor chip and connected by flip chip bonding.

Figure 13:
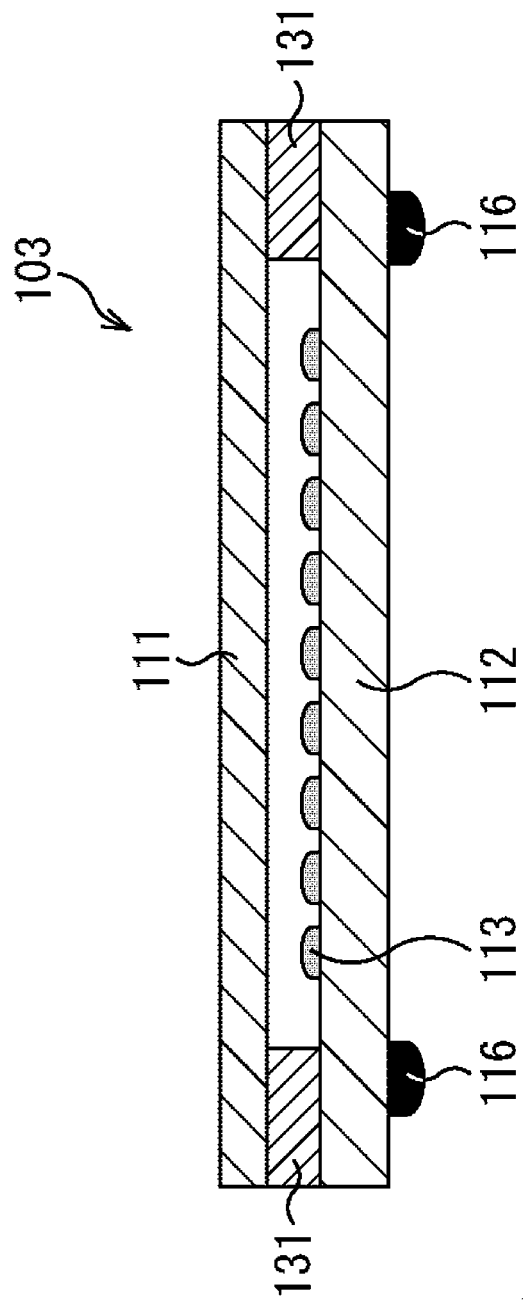
FIG. 13 is a diagram for describing another exemplary configuration of a package structure of a MOS type solid state imaging element according to an embodiment of the present technology.

FIG. 13 is a diagram for describing another exemplary configuration of a package structure of a MOS type solid state imaging element according to an embodiment of the present technology.

In a package structure 103 illustrated in FIG. 13, similarly to the example of FIG. 10, a semiconductor chip 112 over which a plurality of micro lenses 113 are placed is arranged over a ceramic substrate 122. Further, a glass 111 supported by a resin 131 is placed in parallel to the semiconductor chip 112 with a space interposed therebetween.

In the package structure 103 illustrated in FIG. 13, unlike the example of FIG. 10, connecting portions 116 are formed on back sides of right and left ends of the semiconductor chip 112. The convex portion 42a illustrated in FIG. 12 corresponds to the connecting portion 116 illustrated in FIG. 13 and is connected to another conductor part or the like by flip chip bonding.

When a package structure is manufactured as illustrated in FIG. 13, for example, a package structure of a MOS type solid state imaging element of a chip size which is smaller than that illustrated in FIG. 10 can be obtained.

The present technology can be applied to overall electronic devices in which a solid state imaging element is used as an image capturing unit (photoelectric conversion unit) such as an imaging device including a digital still camera or a video camera, a mobile terminal device having an imaging function, or a copy machine in which a solid state imaging element is used as an image scanning unit.

Figure 14:
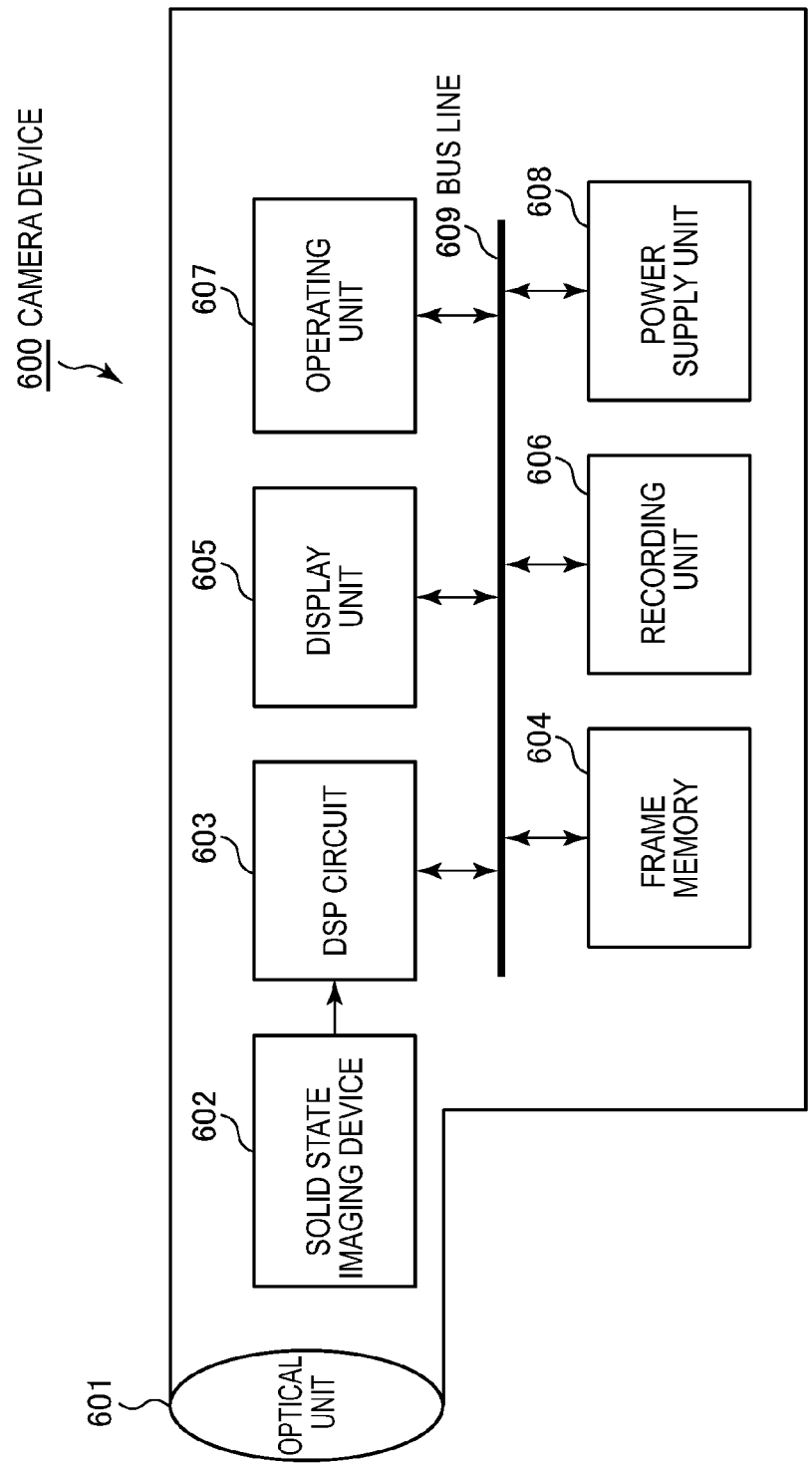
FIG. 14 is a block diagram illustrating an exemplary configuration of a camera device as an electronic device to the present technology is applied.

FIG. 14 is a block diagram illustrating an exemplary configuration of a camera device as an electronic device to the present technology is applied.

A camera device 600 of FIG. 14 includes an optical unit 601 including a lens group, a solid state imaging device (imaging device) 602 in which above-described components of a pixel 2 are employed, and a DSP circuit 603 which is a camera signal processing circuit. The camera device 600 further includes a frame memory 604, a display unit 605, a recording unit 606, an operating unit 607, and a power supply unit 608. The DSP circuit 603, the frame memory 604, the display unit 605, the recording unit 606, the operating unit 607, and the power supply unit 608 are connected to one another via a bus line 609.

The optical unit 601 captures incident light (image light) from a subject and forms an image on an imaging plane of the solid state imaging device 602. The solid state imaging device 602 converts an amount of incident light whose image is formed on the imaging plane through the optical unit 601 into an electrical signal in units of pixels, and outputs the electrical signal as a pixel signal. For example, the MOS type solid state imaging element according to the above-described embodiment may be used as the solid state imaging device 602.

For example, the display unit 605 includes a panel type display device such as a liquid crystal panel or an organic electro luminescence (EL) panel, and displays a moving image or a still image captured by the solid state imaging device 602. The recording unit 606 records a moving image or a still image imaged by the solid state imaging device 602 in a recording medium such as a video tape or a digital versatile disk (DVD).

The operating unit 607 generates an operation command for various functions provided by the camera device 600 according to the user's operation. The power supply unit 608 appropriately supplies various kinds of power used as operation power of the DSP circuit 603, the frame memory 604, the display unit 605, the recording unit 606, and the operating unit 607 to the supply targets.

As described above, as the package structure of the MOS type solid state imaging device according to the above-described embodiment is used as the solid state imaging device 602, even when the depth to the pad electrode is deep, the accuracy of the wire bonding process can be maintained.

The above embodiment has been described in connection with the present technology applied to a package structure of a MOS type solid state imaging element, but the present technology may be applied to another package structure. In other words, the present technology can be applied to various kinds of semiconductor devices.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A semiconductor device including:

a substrate made from a semiconductor material; and layers that are made from plural kinds of materials and formed over the substrate, wherein an opening portion that is formed to penetrate at least a layer formed as an insulating film among the layers formed over the substrate and expose a surface of an electrode pad is filled with aluminum or an aluminum alloy.

(2)

The semiconductor device according to (1), wherein a wire electrically connected to the pad electrode is connected, by wire bonding, to the aluminum or the aluminum alloy with which the opening portion is filled.

(3)

The semiconductor device according to (1) or (2), wherein the aluminum or the aluminum alloy with which the opening portion is filled includes a convex portion protruding from a surface of the semiconductor device.

(4)

The semiconductor device according to (3), wherein the convex portion is pressure-bonded to another conductor electrically connected to the pad electrode, and connected to the other conductor by flip chip bonding.

(5)
The semiconductor device according to any one of (1) to (4),
wherein the aluminum or the aluminum alloy is selectively deposited in the opening portion by a CVD technique and fill the opening portion with the aluminum or the aluminum alloy.

(6)
The semiconductor device according to (5),
wherein the aluminum or the aluminum alloy is deposited by thermal growth using aluminum or an aluminum alloy included in the pad electrode as a seed using a DMAH gas as a dilution gas.

(7)
The semiconductor device according to (5),
wherein vapor-phase grown aluminum or aluminum alloy is deposited in the opening portion using a resist mask.

(8)
The semiconductor device according to any one of (1) to (7),
wherein the semiconductor device is configured as bottom-emission MOS type solid state imaging element.

(9)
The semiconductor device according to any one of (1) to (8),
wherein the semiconductor device is configured as a bottom-emission MOS type solid state imaging element having a stacked structure.

(10)
An electronic device including:
a substrate made from a semiconductor material; and layers that are made from plural kinds of materials and formed over the substrate,
wherein an opening portion that is formed to penetrate at least a layer formed as an insulating film among the layers formed over the substrate and expose a surface of an electrode pad is filled with aluminum or an aluminum alloy.

The present disclosure contains subject matter related to that disclosed in Japanese Priority Patent Application JP 2012-185081 filed in the Japan Patent Office on Aug. 24, 2012, the entire content of which is hereby incorporated by reference.

What is claimed is:

1. A semiconductor device comprising:
a substrate made from a semiconductor material; and
layers that are made from plural types of materials and formed over the substrate,
wherein an opening portion is formed to penetrate at least a layer formed as an insulating film among the layers formed over the substrate and to expose a surface of an electrode pad filled with aluminum or an aluminum alloy,
wherein the opening portion is surrounded by organic substance material and the insulating film,
wherein the aluminum or the aluminum alloy is filled in the opening portion based on a heat resistance of the organic substrate material.

2. The semiconductor device according to claim 1, wherein a wire electrically connected to the electrode pad is connected, by wire bonding, to the aluminum or the aluminum alloy with which the opening portion is filled.

3. The semiconductor device according to claim 1, wherein the aluminum or the aluminum alloy with which the opening portion is filled includes a convex portion protruding from a surface of the semiconductor device.

4. The semiconductor device according to claim 3, wherein the convex portion is pressure-bonded to another conductor electrically connected to the electrode pad, and connected to the other conductor by flip chip bonding.

5. The semiconductor device according to claim 1, wherein the aluminum or the aluminum alloy is selectively deposited in the opening portion by a chemical vapor deposition (CVD) technique to fill the opening portion with the aluminum or the aluminum alloy.

6. The semiconductor device according to claim 5, wherein the aluminum or the aluminum alloy is deposited by thermal growth using aluminum or an aluminum alloy included in the electrode pad as a seed using a dimethyl aluminum hydride (DMAH) gas as a dilution gas.

7. The semiconductor device according to claim 5, wherein vapor-phase grown aluminum or aluminum alloy is deposited in the opening portion using a resist mask.

8. The semiconductor device according to claim 1, wherein the semiconductor device is configured as bottom-emission metal oxide semiconductor (MOS) type solid state imaging element.

9. The semiconductor device according to claim 1, wherein the semiconductor device is configured as a bottom-emission metal oxide semiconductor (MOS) type solid state imaging element having a stacked structure.

10. An electronic device comprising:
a substrate made from a semiconductor material; and
layers that are made from plural types of materials and formed over the substrate,
wherein an opening portion is formed to penetrate at least a layer formed as an insulating film among the layers formed over the substrate and to expose a surface of an electrode pad filled with aluminum or an aluminum alloy,
wherein the opening portion is surrounded by organic substance material and the insulating film,
wherein the aluminum or the aluminum alloy is filled in the opening portion based on a heat resistance of the organic substrate material.

11. The electronic device according to claim 10, wherein a wire electrically connected to the electrode pad is connected, by wire bonding, to the aluminum or the aluminum alloy with which the opening portion is filled.

12. The electronic device according to claim 10, wherein the aluminum or the aluminum alloy with which the opening portion is filled includes a convex portion protruding from a surface of a semiconductor device of the electronic device.

13. The electronic device according to claim 12, wherein the convex portion is pressure-bonded to another conductor electrically connected to the electrode pad, and connected to the other conductor by flip chip bonding.

14. The electronic device according to claim 10, wherein the aluminum or the aluminum alloy is selectively deposited in the opening portion by a chemical vapor deposition (CVD) technique to fill the opening portion with the aluminum or the aluminum alloy.

15. The electronic device according to claim 14, wherein the aluminum or the aluminum alloy is deposited by thermal growth using aluminum or an aluminum alloy included in the electrode pad as a seed using a dimethyl aluminum hydride (DMAH) gas as a dilution gas.

16. The electronic device according to claim 14, wherein vapor-phase grown aluminum or aluminum alloy is deposited in the opening portion using a resist mask.

17. The electronic device according to claim 10, wherein a semiconductor device of the electronic device is configured as bottom-emission metal oxide semiconductor (MOS) type solid state imaging element.

18. The electronic device according to claim 10, wherein a semiconductor device of the electronic device is configured as a bottom-emission metal oxide semiconductor (MOS) type solid state imaging element having a stacked structure.

* * * * *